United States Patent
Yamada

(10) Patent No.: US 11,733,091 B2
(45) Date of Patent: Aug. 22, 2023

(54) OPTICAL DIFFERENCE DETECTOR AND INSPECTION DEVICE

(71) Applicant: HAMAMATSU PHOTONICS K.K., Hamamatsu (JP)

(72) Inventor: Toshiki Yamada, Hamamatsu (JP)

(73) Assignee: HAMAMATSU PHOTONICS K.K., Hamamatsu (JP)

( * ) Notice: Subject to any disclaimer, the term of this patent is extended or adjusted under 35 U.S.C. 154(b) by 7 days.

(21) Appl. No.: 17/539,702

(22) Filed: Dec. 1, 2021

(65) Prior Publication Data

US 2022/0090959 A1 Mar. 24, 2022

Related U.S. Application Data

(63) Continuation of application No. 16/981,524, filed as application No. PCT/JP2019/011522 on Mar. 19, 2019, now Pat. No. 11,243,113.

(30) Foreign Application Priority Data

May 29, 2018 (JP) .................... 2018-102476

(51) Int. Cl.
G01J 1/16 (2006.01)
H01L 31/107 (2006.01)

(52) U.S. Cl.
CPC .......... *G01J 1/1626* (2013.01); *H01L 31/107* (2013.01)

(58) Field of Classification Search
CPC .................. G01J 1/1626; H01L 31/107
See application file for complete search history.

(56) References Cited

U.S. PATENT DOCUMENTS

| 5,805,558 A | 9/1998 | Kimura |
| 6,426,494 B1 | 7/2002 | Kiyota |

(Continued)

FOREIGN PATENT DOCUMENTS

| JP | S61-087440 A | 5/1986 |
| JP | H06-005888 A | 1/1994 |

(Continued)

OTHER PUBLICATIONS

Tomita, A. and Nakamura, K., "Balanced, gated-mode photon detector for quantum-bit discrimination at 1550 nm", Optics Letters, 2002, vol. 27, No. 20, p. 827-p. 829.

(Continued)

*Primary Examiner* — Thanh Luu
(74) *Attorney, Agent, or Firm* — Faegre Drinker Biddle & Reath LLP

(57) ABSTRACT

An optical difference detector includes a first APD and a second APD, a first voltage application unit that applies a first bias voltage to the first APD and a second voltage application unit that applies a second bias voltage to the second APD, a differential amplifier that is connected in parallel to the first APD and the second APD and amplifies a difference between a first signal current output from the first APD and a second signal current output from the second APD, and a feedback control unit that controls the second bias voltage so that a low frequency component of a first monitoring current in the first APD and a low frequency component of a second monitoring current in the second APD are equal.

3 Claims, 6 Drawing Sheets

(56) References Cited

U.S. PATENT DOCUMENTS

| | | |
|---|---|---|
| 7,659,981 B2 | 2/2010 | Lo et al. |
| 2004/0079866 A1* | 4/2004 | Nishiyama ......... H04B 10/6911 |
| | | 250/214 R |
| 2008/0219680 A1 | 9/2008 | Omori et al. |
| 2011/0133058 A1 | 6/2011 | Kang |
| 2013/0334434 A1 | 12/2013 | Nyman et al. |
| 2017/0199154 A1 | 7/2017 | Nakamura |

FOREIGN PATENT DOCUMENTS

| | | |
|---|---|---|
| JP | 2000-200922 A | 7/2000 |
| JP | 2008-219765 A | 9/2008 |
| TW | 200525136 A | 8/2005 |
| WO | WO 2014/132609 A1 | 9/2014 |
| WO | WO 2015/186711 A1 | 12/2015 |
| WO | WO 2017/094495 A1 | 6/2017 |

OTHER PUBLICATIONS

English-language translation of International Preliminary Report on Patentability (IPRP) dated Dec. 11, 2020 that issued in WO Patent Application No. PCT/JP2019/011522.

* cited by examiner

Fig.6
(a)
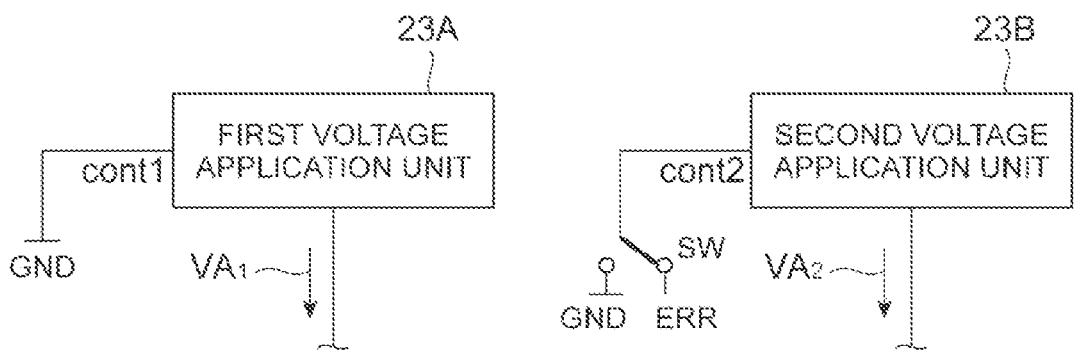
(b)
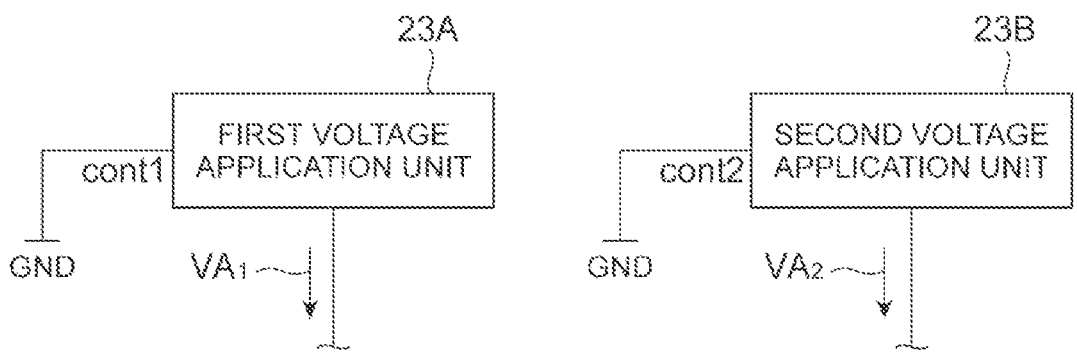

OPTICAL DIFFERENCE DETECTOR AND INSPECTION DEVICE

TECHNICAL FIELD

The present disclosure relates to an optical difference detector and an inspection device.

BACKGROUND ART

Conventionally, an optical difference detector using an avalanche photodiode (hereinafter, "APD") is known. For example, a detector described in Patent Literature 1 includes a first APD connected to a positive bias generation circuit, a second APD connected to a negative bias generation circuit, and an amplifier disposed at a stage subsequent to these APDs, and has a configuration in which differential amplification is possible. The first APD and the second APD are electrically connected in series to the amplifier, and the difference between detection signals output from the two APDs is input to the amplifier. In such a detector, since common-mode signals from the two APDs are removed, common-mode noise is removed. Therefore, it is possible to perform light detection with a high SN ratio.

CITATION LIST

Patent Literature

Patent Literature 1: U.S. Pat. No. 7,659,981

SUMMARY OF INVENTION

Technical Problem

In each APD, the amplification factor of the signal current with respect to light is determined by the bias voltage applied between the cathode and the anode. When APDs are used as an optical difference detector, it is necessary to apply a bias voltage to each APD so that the amplification factors of the two APDs are equal. However, since it is necessary to apply a relatively high bias voltage of about 100 V to the APD, there is a problem that it is difficult to accurately match the positive and negative bias voltages. In addition, in practice, there is a variation in the amplification factor of each APD with respect to the bias voltage, and there is an influence due to the temperature characteristics of the APD. Therefore, even if bias voltages having the same absolute value are applied to the two APDs, the amplification factors of the two APDs may not be the same, so that the effect of removing common-mode noise may not be sufficiently obtained.

The present disclosure has been made to solve the aforementioned problems, and it is an object of the present disclosure to provide an optical difference detector that makes it easy to adjust bias voltages and sufficiently enhances the effect of removing common-mode noise and an inspection device using the same.

Solution to Problem

In order to solve the aforementioned problems, an optical difference detector according to an aspect of the present disclosure includes: a first avalanche photodiode and a second avalanche photodiode that amplify and output a signal current according to input light; a first voltage application unit that applies a first bias voltage to the first avalanche photodiode and a second voltage application unit that applies a second bias voltage to the second avalanche photodiode; a differential amplifier that is connected in parallel to the first avalanche photodiode and the second avalanche photodiode and amplifies a difference between a first signal current output from the first avalanche photodiode and a second signal current output from the second avalanche photodiode; and a feedback control unit that controls at least one of the first bias voltage and the second bias voltage so that a low frequency component of a first monitoring current in the first avalanche photodiode and a low frequency component of a second monitoring current in the second avalanche photodiode are equal.

In the optical difference detector, the first avalanche photodiode and the second avalanche photodiode are connected in parallel to the differential amplifier. According to this configuration, since the bias voltage having one of the positive and negative polarities may be applied to the first avalanche photodiode and the second avalanche photodiode, it becomes easy to adjust the bias voltage. Besides, it is possible to make the amplification factors of the avalanche photodiodes the same by controlling at least one of the first bias voltage and the second bias voltage using the low frequency component of the first monitoring current and the low frequency component of the second monitoring current. As a result, common-mode signals from the avalanche photodiodes are sufficiently removed and the effect of removing the common-mode noise is enhanced, so that it is possible to perform light detection with a high SN ratio.

The first monitoring current may be a first bias current flowing through the first avalanche photodiode due to application of the first bias voltage, and the second monitoring current may be a second bias current flowing through the second avalanche photodiode due to application of the second bias voltage. In this case, it is possible to easily realize the configuration of the feedback control unit that controls the control voltage. In addition, since the low frequency component can be monitored without depending on the intensity of the input light, the stability of the feedback control can be secured.

The first monitoring current may be the first signal current output from the first avalanche photodiode, and the second monitoring current may be the second signal current output from the second avalanche photodiode. Also in this case, it is possible to easily realize the configuration of the feedback control unit that controls the control voltage.

In addition, an optical difference detector according to an aspect of the present disclosure includes: a first avalanche photodiode and a second avalanche photodiode that amplify and output a signal current according to input light; a first voltage application unit that applies a first bias voltage to the first avalanche photodiode and a second voltage application unit that applies a second bias voltage to the second avalanche photodiode; a differential amplifier that is connected in parallel to the first avalanche photodiode and the second avalanche photodiode and amplifies a difference between a first signal current output from the first avalanche photodiode and a second signal current output from the second avalanche photodiode; an optical attenuator that attenuates input light to the first avalanche photodiode or input light to the second avalanche photodiode; and a feedback control unit that controls an amount of attenuation of the input light by the optical attenuator so that a low frequency component of a first monitoring current in the first avalanche photodiode and a low frequency component of a second monitoring current in the second avalanche photodiode are equal.

In this optical difference detector, the first avalanche photodiode and the second avalanche photodiode are connected in parallel to the difference amplifier. According to this configuration, since the bias voltage having one of the positive and negative polarities may be applied to the first avalanche photodiode and the second avalanche photodiode, it becomes easy to adjust the bias voltage. In addition, it is possible to make the amounts of input light to the respective avalanche photodiodes the same by controlling the amount of attenuation of the input light by the optical attenuator using the low frequency component of the first monitoring current and the low frequency component of the second monitoring current. As a result, common-mode signals from the avalanche photodiodes are sufficiently removed and the effect of removing the common-mode noise is enhanced, so that it is possible to perform light detection with a high SN ratio.

The first monitoring current may be a first bias current flowing through the first avalanche photodiode due to application of the first bias voltage, and the second monitoring current may be a second bias current flowing through the second avalanche photodiode due to application of the second bias voltage. In this case, it is possible to easily realize the configuration of the feedback control unit that controls the amount of attenuation of the input light.

The first monitoring current may be the first signal current output from the first avalanche photodiode, and the second monitoring current may be the second signal current output from the second avalanche photodiode. Also in this case, it is possible to easily realize the configuration of the feedback control unit that controls the amount of attenuation of the input light.

In addition, an inspection device according to an aspect of the present disclosure includes: a light source that outputs inspection light toward a measurement target; a magneto-optical crystal that is disposed so as to face the measurement target; and the optical difference detector described above. The first avalanche photodiode detects first inspection light having a first polarization component output from the light source and reflected by the magneto-optical crystal, and the second avalanche photodiode detects second inspection light having a second polarization component output from the light source and reflected by the magneto-optical crystal.

In the inspection device, it is possible to make the amplification factors of respective avalanche photodiodes or the amounts of input light to respective avalanche photodiodes the same in the optical difference detector. As a result, common-mode signals from the respective avalanche photodiodes are sufficiently removed, and the effect of removing the common-mode noise is enhanced. Therefore, since it is possible to perform light detection with a high SN ratio, it is possible to inspect the measurement target with high accuracy.

Advantageous Effects of Invention

In the optical difference detector and the inspection device, it is easy to adjust the bias voltages, and the effect of removing common-mode noise can be sufficiently enhanced.

BRIEF DESCRIPTION OF DRAWINGS

FIG. 6 is a diagram illustrating a modification example of a voltage application unit.

DESCRIPTION OF EMBODIMENTS

Hereinafter, preferred embodiments of an optical difference detector and an inspection device according to an aspect of the present disclosure will be described in detail with reference to the diagrams

[Inspection Device]

Figure 1:
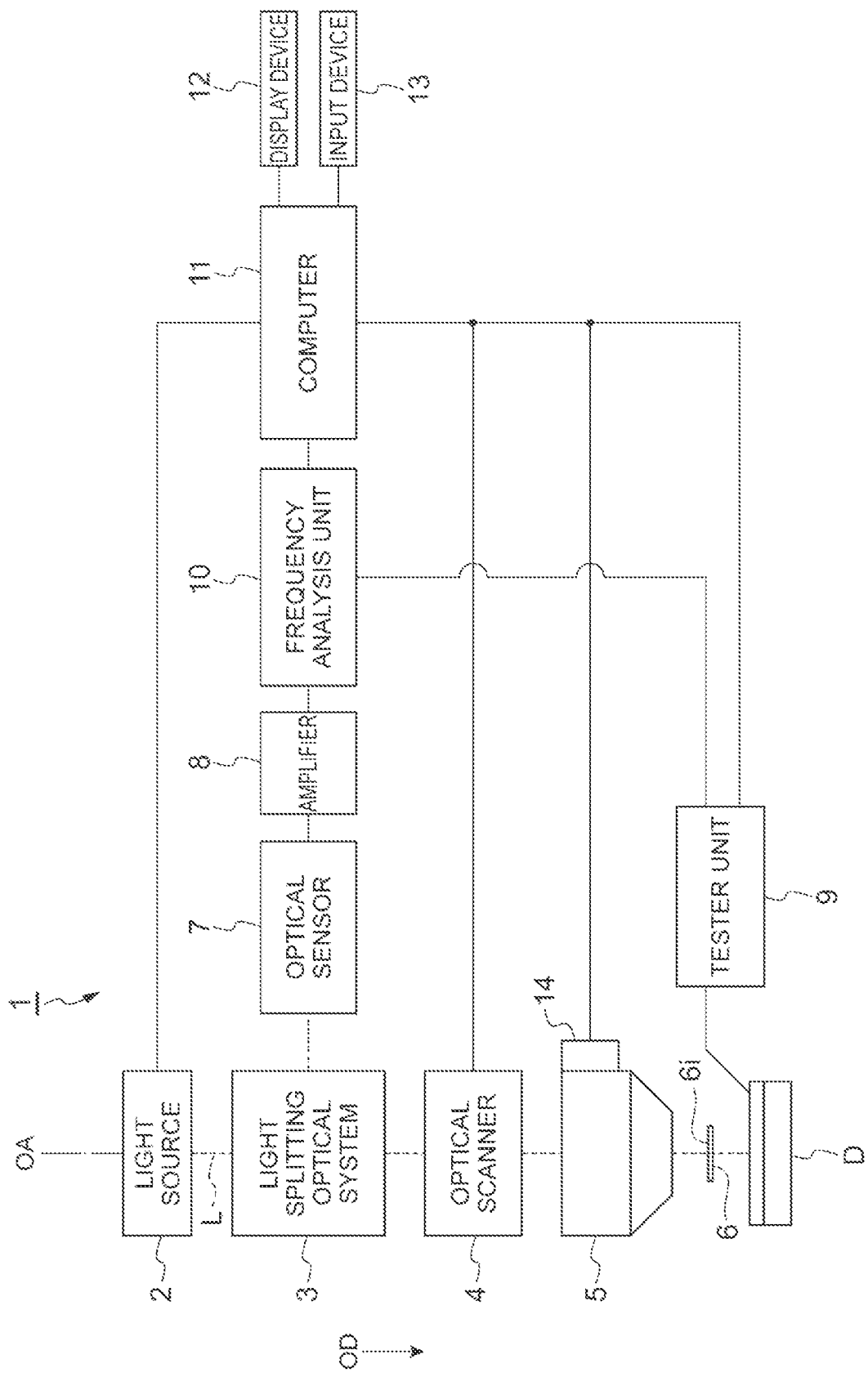
FIG. 1 is a diagram illustrating an embodiment of an inspection device.

FIG. 1 is a diagram illustrating an embodiment of an inspection device. An inspection device 1 illustrated in the figure is configured as a device that specifies an abnormality occurrence location in a semiconductor device D, which is a measurement target, using inspection light L. The inspection device 1 includes a light source 2, a light splitting optical system 3, an optical scanner 4, an objective lens 5, a magneto-optical crystal 6, an optical sensor 7, and an amplifier 8 as elements for guiding and detecting the inspection light L. In addition, the inspection device 1 includes a tester unit 9, a frequency analysis unit 10, a computer 11, a display device 12, and an input device 13 as elements for analyzing the inspection light L.

Examples of the semiconductor device D, which is a measurement target, include an individual semiconductor element (discrete) including a diode or a power transistor, an optoelectronic element, a sensor/actuator, a logic LSI (Large Scale Integration) formed by transistors having a MOS (Metal-Oxide-Semiconductor) structure or a bipolar structure, a memory element, a linear IC (Integrated Circuit), and a hybrid device thereof. In addition, the semiconductor device D may be a package including a semiconductor device, a composite substrate, or the like.

The light source 2 is a device that outputs the inspection light L toward the magneto-optical crystal 6 and the semiconductor device D. The inspection light L may be either CW (continuous wave) light or pulsed light. The inspection light L may be either incoherent light or coherent light. Examples of the light source that outputs incoherent light include an SLD (Super Luminescent Diode), an ASE (Amplified Spontaneous Emission), and an LED (Light Emitting Diode). In addition, as the light source 2 that outputs coherent light, a solid-state laser light source, a semiconductor laser light source, and the like can be used.

In addition, the wavelength of the inspection light L is, for example, 530 nm or more. The wavelength of the inspection light L may be 1064 nm or more. The inspection light L output from the light source 2 is guided to the optical scanner 4 through the light splitting optical system 3 using a polarization-maintaining single-mode optical coupler and a polarization-maintaining single-mode optical fiber for probe light, for example.

The optical scanner 4 is formed by an optical scanning element, such as a galvano mirror or an MEMS (micro electromechanical system) mirror. The optical scanner 4 scans a selected region on an incident surface 6i of the magneto-optical crystal 6 with the inspection light L. The selection region is set, for example, by a user operation input to the computer 11 through the input device 13. The selected region is set as a two-dimensional area, a one-dimensional line, or a spot with respect to the incident surface 6i of the magneto-optical crystal 6.

The objective lens 5 focuses the inspection light L guided by the light splitting optical system 3 and the optical scanner 4 on the magneto-optical crystal 6. The objective lens 5 is configured to be switchable between a low-magnification objective lens (for example, 5 times) and a high-magnification objective lens (for example, 50 times) by a turret or the like. An objective lens driving unit 14 is attached to the objective lens 5. The objective lens driving unit 14 displaces the objective lens 5 along an optical axis direction OD of the inspection light L, so that the focus position of the objective lens 5 is adjusted in the optical axis direction OD.

Due to the magneto-optical effect, the magneto-optical crystal 6 changes the polarization state of the inspection light L input from the incident surface 6i according to the magnetic field generated in the semiconductor device D. For example, when a failure, such as the generation of a leak current in the semiconductor device D, occurs, a change in the magnetic field different from that in a normal state may occur at the failure location. Therefore, in the magneto-optical crystal 6, a change in the magnetic field at the failure location is output as a change in the polarization state of the inspection light L.

The inspection light L reflected by the magneto-optical crystal 6 returns to the light splitting optical system 3 through the objective lens 5 and the optical scanner 4, and is guided to the optical sensor 7 through the optical fiber for return light. Here, the optical sensor 7 is formed by any of optical difference detectors 21A to 21D described later. The optical sensor 7 has two detection elements (first APD 22A and second APD 22B: refer to FIG. 2 and the like) that detect different polarization components of the inspection light L reflected by the magneto-optical crystal 6. The optical sensor 7 outputs a differential signal based on the intensity of light detected by these detection elements to the amplifier 8.

The light splitting optical system 3 is configured to include a Faraday rotator and a polarization beam splitter. The S-polarized component (first inspection light) of the inspection light L reflected by the magneto-optical crystal 6 is reflected by the first polarization beam splitter and is incident on one detection element of the optical sensor 7. In addition, the P-polarized component of the inspection light L reflected by the magneto-optical crystal 6 has a polarization plane rotated by the Faraday rotator and becomes S-polarized component light. The S-polarized component light (second inspection light) is reflected by the second polarization beam splitter and is incident on the other detection element of the optical sensor 7.

The differential signal output from the optical sensor 7 is amplified by the amplifier 8 and input to the frequency analysis unit 10 as an amplified signal. The frequency analysis unit 10 extracts a measurement frequency component in the amplified signal and outputs the extracted signal to the computer 11 as an analysis signal. The measurement frequency is set based on the modulation frequency of the modulation current signal applied to the semiconductor device D, for example. As the frequency analysis unit 10, for example, a lock-in amplifier, a spectrum analyzer, a network analyzer, a digitizer, and a cross domain analyzer (registered trademark) can be used.

In the present embodiment, the tester unit 9 repeatedly applies a predetermined modulation current signal to the semiconductor device D. The tester unit 9 is electrically connected to the frequency analysis unit 10 by, for example, a timing signal cable. In the semiconductor device D, a modulation magnetic field is generated according to the modulation current signal. The optical signal according to the modulation magnetic field is detected by the optical sensor 7, which will be described later, so that lock-in detection based on a specific frequency becomes possible. The S/N can be improved by performing the lock-in detection. In addition, the tester unit 9 does not necessarily need to apply the modulation current signal, and may apply a CW (continuous wave) current signal for generating pulsed light according to the detection frequency.

The computer 11 is physically configured to include a memory such as a RAM and a ROM, a processor such as a CPU, a communication interface, and a storage unit such as a hard disk. Examples of the computer 11 include a personal computer, a microcomputer, a cloud server, and a smart device (a smartphone, a tablet terminal, and the like). For example, the input device 13 for inputting an operation by the user and a display device 23 for showing a measurement result and the like to the user are connected to the computer 11. The processor of the computer 11 executes a function of controlling the light source 2, the optical scanner 4, the objective lens driving unit 14, the tester unit 9, the optical sensor 7, and the frequency analysis unit 10. In addition, the processor of the computer 11 executes a function of generating a magnetic distribution image, a magnetic frequency plot, or the like based on the analysis signal from the frequency analysis unit 10.

First Embodiment of Optical Difference Detector

Figure 2:
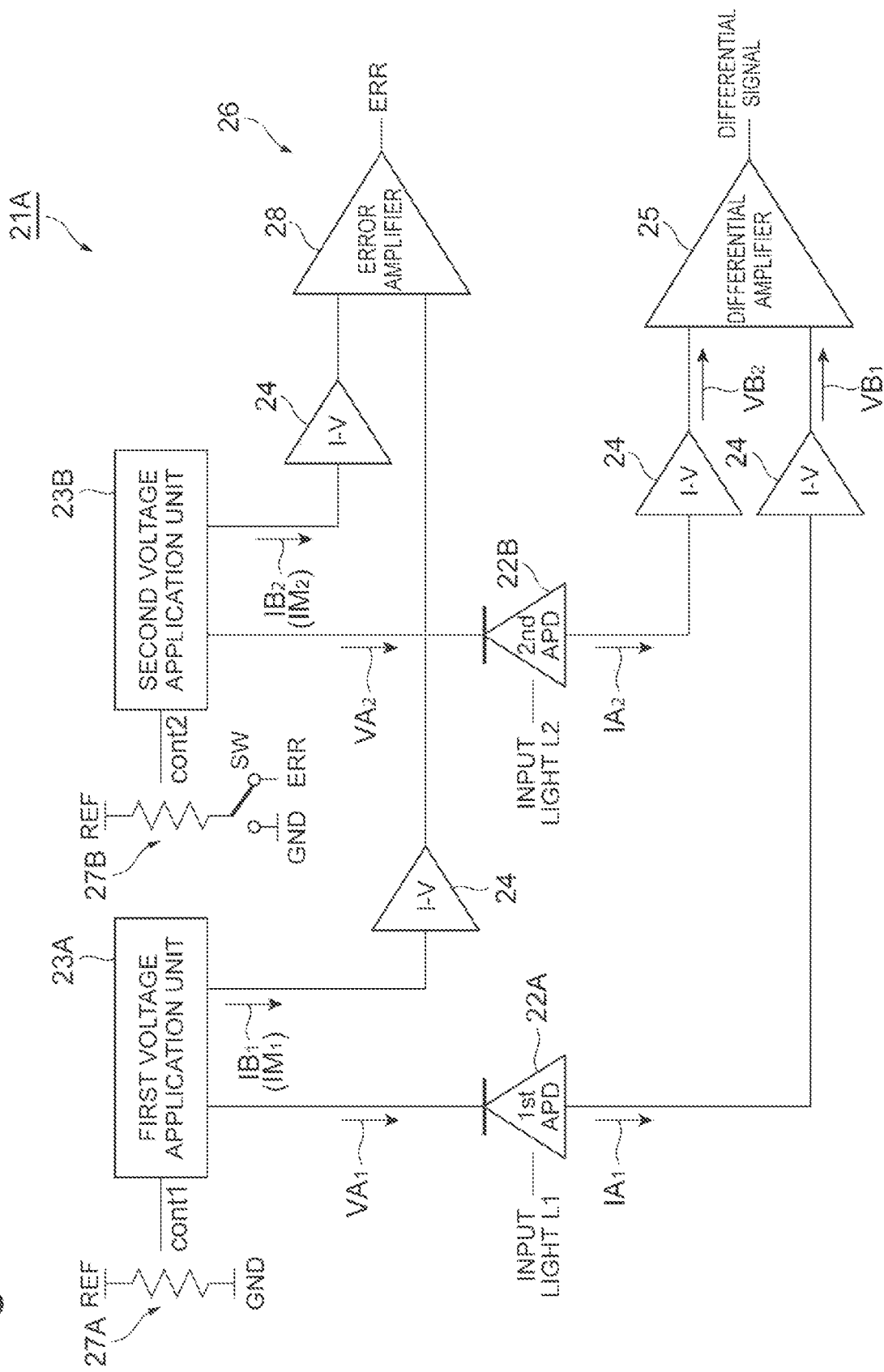
FIG. 2 is a diagram illustrating a first embodiment of an optical difference detector.

Next, the optical difference detector that forms the above-described optical sensor 7 will be described in more detail. FIG. 2 is a diagram illustrating a first embodiment of the optical difference detector. The optical difference detector 21A includes two avalanche photodiodes (hereinafter, referred to as "APD") as detection elements. The optical difference detector 21A amplifies and outputs the difference between the detection signals output from these APDs. In the differential signal output from the optical difference detector 21A, since common-mode signals from the two APDs are removed, common-mode noise is removed. Therefore, in the optical difference detector 21A, it is possible to perform light detection with a high SN ratio.

As illustrated in FIG. 2, the optical difference detector 21A includes a first APD 22A and a second APD 22B, a first voltage application unit 23A and a second voltage application unit 23B, a plurality of current-voltage converters 24, a differential amplifier 25, and a feedback control unit 26.

The first APD 22A and the second APD 22B are detection elements that amplify and output a signal current according to input light. The first APD 22A and the second APD 22B have independent bias circuits. That is, the amplification factor of the signal current by the first APD 22A is controlled by a first bias voltage $VA_1$ applied from the first voltage application unit 23A, and the amplification factor of the signal current by the second APD 22B is controlled by a second bias voltage $VA_2$ applied from the second voltage application unit 23B. The first APD 22A and the second APD 22B are electrically connected in parallel to the differential amplifier 25.

Input light L1 input to the first APD 22A is S-polarized component light (first inspection light) of the inspection light L reflected by the magneto-optical crystal 6. The first APD 22A outputs a first signal current $IA_1$ according to the intensity of the input light L1. The first signal current $IA_1$ is converted into a first signal voltage $VB_1$ by the current-voltage converter 24, and the first signal voltage $VB_1$ is input to the differential amplifier 25. Input light L2 input to the second APD 22B is a P-polarized component of the inspection light L reflected by the magneto-optical crystal 6, and its polarization plane is rotated by the Faraday rotator to make S-polarized component light (second inspection light). The second APD 22B outputs a second signal current $IA_2$ according to the intensity of the input light L2. The second signal current $IA_2$ is converted into a second signal voltage $VB_2$ by the current-voltage converter 24, and the second signal voltage $VB_2$ is input to the differential amplifier 25.

The first voltage application unit 23A is a unit that supplies the first bias voltage $VA_1$ to the first APD 22A. A first resistance voltage dividing circuit 27A is connected to the first voltage application unit 23A. A control voltage cont1 in the first voltage application unit 23A is generated by the first resistance voltage dividing circuit 27A. The second voltage application unit 23B is a unit that supplies the second bias voltage $VA_2$ to the second APD 22B. A second resistance voltage dividing circuit 27B is connected to the second voltage application unit 23B. A control voltage cont2 in the second voltage application unit 23B is generated by the second resistance voltage dividing circuit 27B.

The first APD 22A and the second APD 22B are electrically connected in parallel to the differential amplifier 25. Therefore, the first bias voltage $VA_1$ and the second bias voltage $VA_2$ may have either positive or negative polarity. In the present embodiment, both the first bias voltage $VA_1$ and the second bias voltage $VA_2$ are positive bias voltages. The differential amplifier 25 amplifies the difference between the first signal voltage from the first APD 22A and the second signal voltage from the second APD 22B to generate a differential signal. The differential amplifier 25 outputs the generated differential signal to the amplifier 8 (refer to FIG. 1).

The feedback control unit 26 is a unit that controls at least one of the first bias voltage $VA_1$ and the second bias voltage $VA_2$. In the present embodiment, the feedback control unit 26 controls the second bias voltage $VA_2$. In controlling the second bias voltage $VA_2$, the feedback control unit 26 includes an error amplifier 28. In addition, a switch SW for switching between a ground terminal GND and an error terminal ERR is provided in the second resistance voltage dividing circuit 27B of the second voltage application unit 23B.

A first bias current $IB_1$ (first monitoring current $IM_1$) to be supplied to the first APD 22A is output from the first voltage application unit 23A. The first bias current $IB_1$ is converted into a voltage by the current-voltage converter 24 and then input to the error amplifier 28. A second bias current $IB_2$ (second monitoring current $IM_2$) to be supplied to the second APD 22B is output from the second voltage application unit 23B. The second bias current $IB_2$ is converted into a voltage by the current-voltage converter 24 and then input to the error amplifier 28.

The error amplifier 28 has the error terminal ERR as an output terminal. The error amplifier 28 extracts low frequency components of the two input voltages and outputs a differential voltage, which is obtained by performing subtraction between the low frequency components, to the second resistance voltage dividing circuit 27B. Therefore, the potential of the error terminal ERR changes according to the differential voltage. In the second voltage application unit 23B, when the switch SW is connected to the ground terminal GND, no feedback control is performed. On the other hand, in the second voltage application unit 23B, when the switch SW is connected to the error terminal ERR, feedback control is performed so that the two low frequency components input to the error amplifier 28 are equal. When the switch SW is connected to the error terminal ERR, a voltage obtained by the resistance voltage division of the second resistance voltage dividing circuit 27B, of the output voltage from the error amplifier 28, is the control voltage cont2 of the second voltage application unit 23B. That is, the second bias voltage $VA_2$ applied to the second APD 22B from the second voltage application unit 23B is adjusted based on the output voltage of the error amplifier 28.

As described above, in the optical difference detector 21A, the first APD 22A and the second APD 22B are connected in parallel to the differential amplifier 25. According to this configuration, unlike a case where two APDs are electrically connected in series to an amplifier, a bias voltage having one of the positive and negative polarities may be applied to the first APD 22A and the second APD 22B. Therefore, it becomes easy to adjust the bias voltage. Besides, it is possible to make the amplification factors of the first APD 22A and the second APD 22B the same by controlling at least one (here, the second bias voltage $VA_2$) of the first bias voltage $VA_1$ and the second bias voltage $VA_2$ using the low frequency component of the first monitoring current $IM_1$ and the low frequency component of the second monitoring current $IM_2$. As a result, common-mode signals from the first APD 22A and the second APD 22B are sufficiently removed and the effect of removing the common-mode noise is enhanced, so that the inspection device 1 can perform light detection with a high SN ratio.

In addition, in the optical difference detector 21A, the first monitoring current $IM_1$ is the first bias current $IB_1$ flowing through the first APD 22A due to the application of the first bias voltage $VA_1$, and the second monitoring current $IM_2$ is the second bias current $IB_2$ flowing through the second APD 22B due to the application of the second bias voltage $VA_2$. With such a configuration, it is possible to easily realize the configuration of the feedback control unit 26 that controls the control voltage. In addition, since the low frequency component can be monitored without depending on the intensity of the input light L1 and L2, the stability of the feedback control can be secured.

Second Embodiment of Optical Difference Detector

Figure 3:
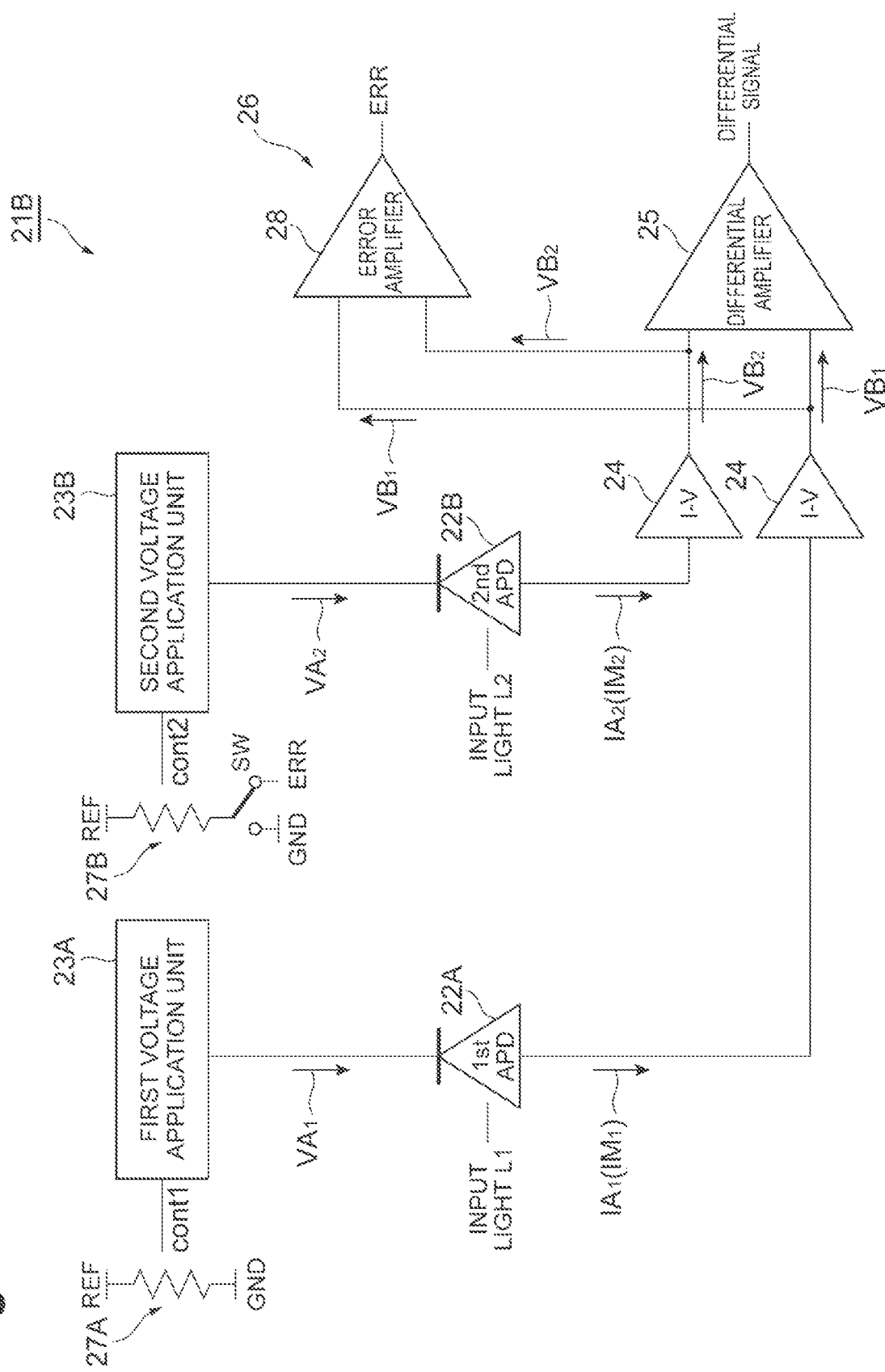
FIG. 3 is a diagram illustrating a second embodiment of the optical difference detector.

FIG. 3 is a diagram illustrating a second embodiment of the optical difference detector. The optical difference detector 21B according to the second embodiment is common to the first embodiment in that the first APD 22A and the second APD 22B are connected in parallel to the differential amplifier 25, but a monitoring current used for feedback control is different from that in the first embodiment.

In the optical difference detector 21B, the first monitoring current $IM_1$ is the first signal current $IA_1$ output from the first APD 22A, and the second monitoring current $IM_2$ is the second signal current $IA_2$ output from the second APD 22B. More specifically, as illustrated in FIG. 3, in the optical difference detector 21B, the first signal current $IA_1$ output from the first APD 22A is converted into the first signal voltage $VB_1$ by the current-voltage converter 24, and the first signal voltage $VB_1$ is input to both the differential amplifier 25 and the error amplifier 28. In addition, the second signal current $IA_2$ output from the second APD 22B is converted into the second signal voltage $VB_2$ by the current-voltage converter 24, and the second signal voltage $VB_2$ is input to both the differential amplifier 25 and the error amplifier 28.

Also in such an optical difference detector 21B, since a bias voltage having one of positive and negative polarities may be applied to the first APD 22A and the second APD 22B, it becomes easy to adjust the bias voltage. In addition, it is possible to make the amplification factors of the first APD 22A and the second APD 22B the same by controlling at least one (here, the second bias voltage $VA_2$) of the first bias voltage $VA_1$ and the second bias voltage $VA_2$ using the low frequency component of the first monitoring current $IM_1$ and the low frequency component of the second monitoring current $IM_2$. Therefore, common-mode signals from the first APD 22A and the second APD 22B are sufficiently removed and the effect of removing the common-mode noise is enhanced, so that the inspection device 1 can perform light detection with a high SN ratio.

In addition, in the optical difference detector 21B, the first monitoring current $IM_1$ is the first signal current $IA_1$ output from the first APD 22A, and the second monitoring current $IM_2$ is the second signal current $IA_2$ output from the second APD 22B. With such a configuration, it is possible to easily realize the configuration of the feedback control unit 26 that controls the control voltage.

Third Embodiment of Optical Difference Detector

Figure 4:
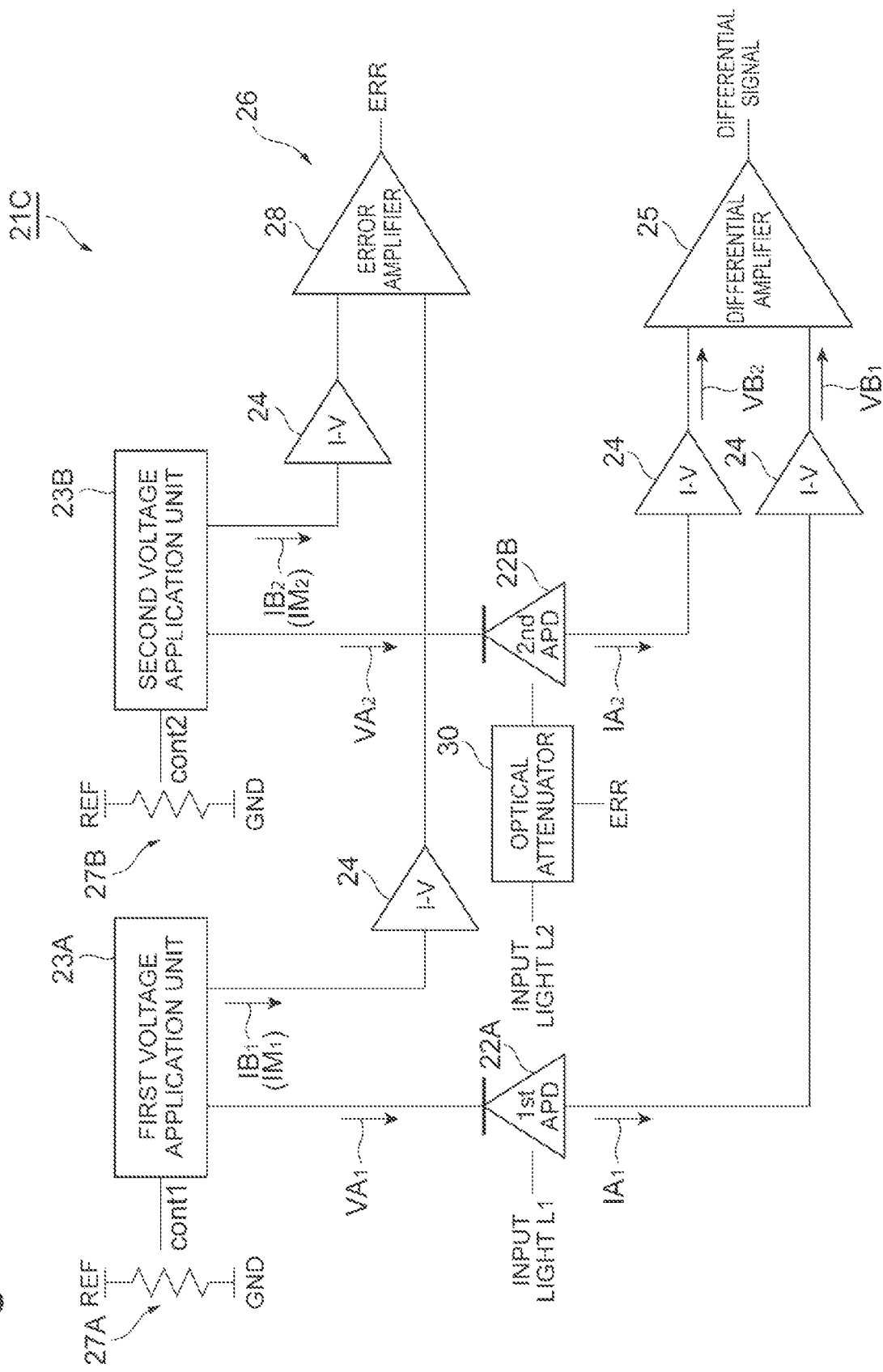
FIG. 4 is a diagram illustrating a third embodiment of the optical difference detector.

FIG. 4 is a diagram illustrating a third embodiment of the optical difference detector. The optical difference detector 21C according to the third embodiment is common to the first and second embodiments in that the first APD 22A and the second APD 22B are connected in parallel to the differential amplifier 25, but is different from the first and second embodiments in that the target of the feedback control is the amount of input light L1 and L2 input to the first APD 22A and the second APD 22B.

In the optical difference detector 21C, as illustrated in FIG. 4, the first monitoring current $IM_1$ is the first bias current $IB_1$ flowing through the first APD 22A due to the application of the first bias voltage $VA_1$, and the second monitoring current $IM_2$ is the second bias current $IB_2$ flowing through the second APD 22B due to the application of the second bias voltage $VA_2$. Both the first bias current $IB_1$ and the second bias current $IB_2$ are converted into a voltage by the current-voltage converter 24 and then input to the error amplifier 28.

In addition, an optical attenuator 30 that attenuates the input light L1 to the first APD 22A or the input light L2 to the second APD 22B is disposed in the optical difference detector 21C. In the optical difference detector 21C, the feedback control unit 26 that controls the amount of attenuation of the input light L1 and L2 input to the second APD 22B is formed by the error amplifier 28 and the optical attenuator 30. In the present embodiment, the optical attenuator 30 is connected to the input side of the second APD 22B to adjust the amount of the input light L2. In addition, the error terminal ERR of the error amplifier 28 is connected to the optical attenuator 30. In the optical attenuator 30, feedback control of the amount of the input light L2 is performed so that the low frequency components of the two voltages input to the error amplifier 28 are equal.

Also in such an optical difference detector 21C, since a bias voltage having one of the positive and negative polarities may be applied to the first APD 22A and the second APD 22B, it becomes easy to adjust the bias voltage. In addition, it is possible to make the amounts of the input light L1 and L2 to the first APD 22A and the second APD 22B the same by controlling the amount of attenuation of the input light L2 by the optical attenuator 30 using the low frequency component of the first monitoring current $IM_1$ and the low frequency component of the second monitoring current $IM_2$. As a result, common-mode signals from the first APD 22A and the second APD 22B are sufficiently removed and the effect of removing the common-mode noise is enhanced, so that the inspection device 1 can perform light detection with a high SN ratio.

In addition, in the optical difference detector 21C, the first monitoring current $IM_1$ is the first bias current $IB_1$ flowing through the first APD 22A due to the application of the first bias voltage $VA_1$, and the second monitoring current $IM_2$ is the second bias current $IB_2$ flowing through the second APD 22B due to the application of the second bias voltage $VA_2$. With such a configuration, it is possible to easily realize the configuration of the feedback control unit 26 that controls the amount of attenuation of the input light L2.

Fourth Embodiment of Optical Difference Detector

Figure 5:
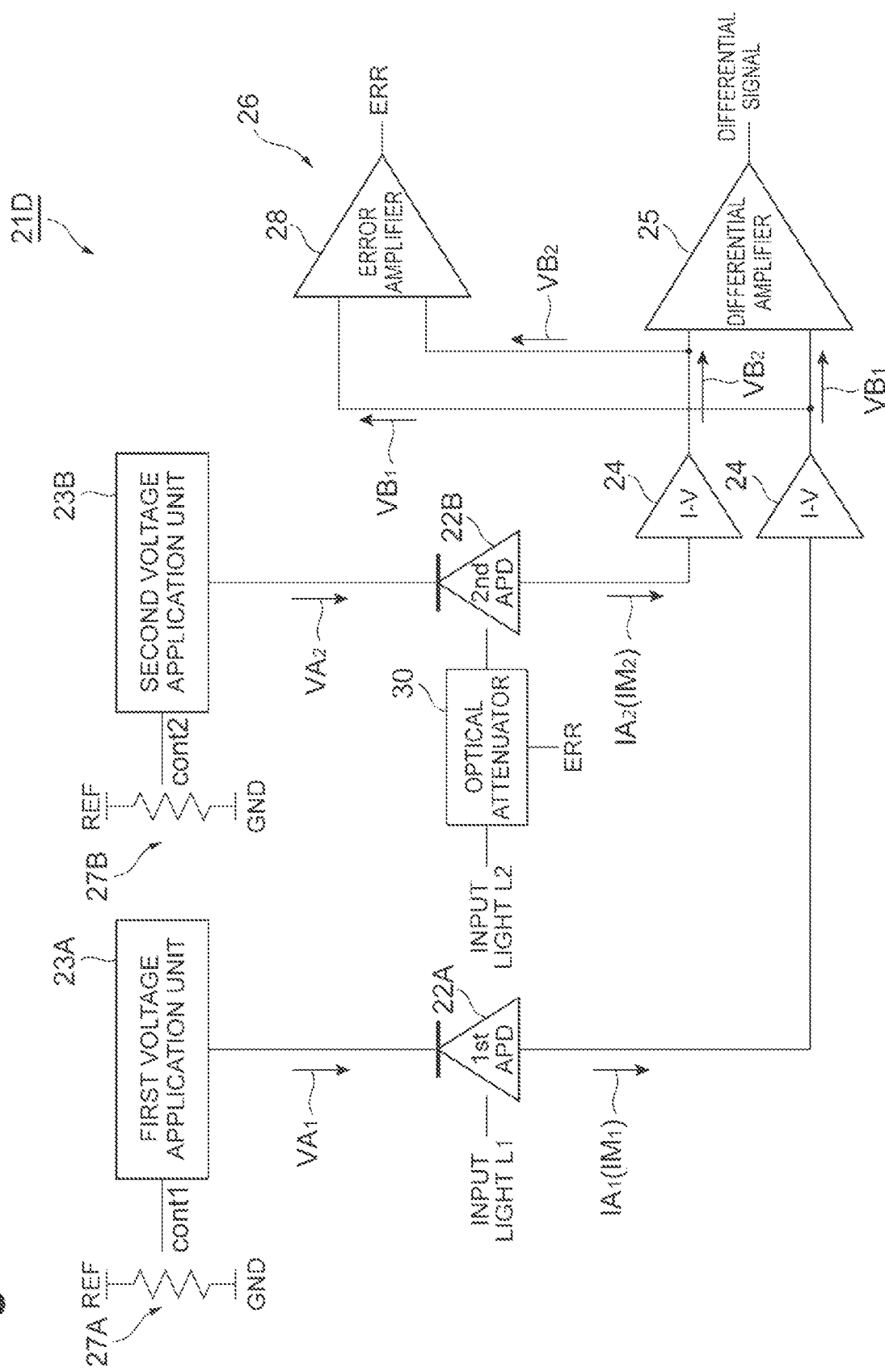
FIG. 5 is a diagram illustrating a fourth embodiment of the optical difference detector.

FIG. 5 is a diagram illustrating a fourth embodiment of the optical difference detector. In the optical difference detector 21D according to the fourth embodiment, a monitoring current used for feedback control is different from that in the third embodiment.

In the optical difference detector 21D, as illustrated in FIG. 5, the first monitoring current $IM_1$ is the first signal current $IA_1$ output from the first APD 22A, and the second monitoring current $IM_2$ is the second signal current $IA_2$ output from the second APD 22B. In the optical difference detector 21D, the first signal current $IA_1$ output from the first APD 22A is converted into the first signal voltage $VB_1$ by the current-voltage converter 24, and the first signal voltage $VB_1$ is input to both the differential amplifier 25 and the error amplifier 28. In addition, the second signal current $IA_2$ output from the second APD 22B is converted into the second signal voltage $VB_2$ by the current-voltage converter 24, and the second signal voltage $VB_2$ is input to both the differential amplifier 25 and the error amplifier 28. In the optical attenuator 30, feedback control of the amount of the input light L2 is performed so that the low frequency components of the two voltages input to the error amplifier 28 are equal.

Also in such an optical difference detector 21D, since a bias voltage having one of the positive and negative polarities may be applied to the first APD 22A and the second APD 22B, it becomes easy to adjust the bias voltage. In addition, it is possible to make the amounts of the input light L1 and L2 to the first APD 22A and the second APD 22B the same by controlling the amount of attenuation of the input light L2 by the optical attenuator 30 using the low frequency component of the first monitoring current $IM_1$ and the low frequency component of the second monitoring current $IM_2$. As a result, common-mode signals from the first APD 22A and the second APD 22B are sufficiently removed and the effect of removing the common-mode noise is enhanced, so that the inspection device 1 can perform light detection with a high SN ratio.

In addition, in the optical difference detector 21D, the first monitoring current is the first signal current output from the first APD 22A, and the second monitoring current is the second signal current output from the second APD 22B. With such a configuration, it is possible to easily realize the configuration of the feedback control unit 26 that controls the amount of attenuation of the input light L2.

Modification Example of Optical Difference Detector

The present disclosure is not limited to the embodiments described above. For example, in the embodiments described above, the control voltage cont1 of the first voltage application unit 23A is generated by the first resistance voltage dividing circuit 27A, and the control voltage cont2 of the second voltage application unit 23B is generated by the second resistance voltage dividing circuit 27B. However, it is not always necessary to use the resistance voltage division to generate a control voltage. For example, a DAC (Digital to Analog Converter) or a microcomputer may be used to generate a control voltage.

In this case, the DAC or the microcomputer may be included in the first voltage application unit 23A and the second voltage application unit 23B. Therefore, in the cases of the first embodiment and the second embodiment, as illustrated in FIG. 6(a), the first voltage application unit 23A may be connected to the ground terminal GND, and the second voltage application unit 23B may be connected to the switch SW. In addition, in the cases of the third embodiment and the fourth embodiment, as illustrated in FIG. 6(b), each of the first voltage application unit 23A and the second voltage application unit 23B may be connected to the ground terminal GND.

REFERENCE SIGNS LIST

1: inspection device, 2: light source, 6: magneto-optical crystal, 21A to 21D: optical difference detector, 22A: first APD, 22B: second APD, 23A: first voltage application unit, 23B: second voltage application unit, 25: differential amplifier, 26: feedback control unit, 30: optical attenuator, D: semiconductor device (measurement target), L1, L2: input light, $IM_1$: first monitoring current, $IM_2$: second monitoring current, $VA_1$: first bias voltage, $VA_2$: second bias voltage, $IA_1$: first signal current, $IA_2$: second signal current, $IB_1$: first bias current, $IB_2$: second bias current.

The invention claimed is:

1. A detector, comprising:
a first avalanche photodiode and a second avalanche photodiode configured to amplify and to output a signal current according to input light;
a first voltage applicator configured to apply a first bias voltage to the first avalanche photodiode and a second voltage applicator configured to apply a second bias voltage to the second avalanche photodiode;
a differential amplifier configured to be connected in parallel to the first avalanche photodiode and the second avalanche photodiode and to amplify a difference between a first signal current output from the first avalanche photodiode and a second signal current output from the second avalanche photodiode; and
a feedback controller configured to control at least one of the first bias voltage and the second bias voltage so that a low frequency component of a first monitoring current in the first avalanche photodiode and a low frequency component of a second monitoring current in the second avalanche photodiode are equal,
wherein the first monitoring current is a first bias current flowing through the first avalanche photodiode due to application of the first bias voltage, and the second monitoring current is a second bias current flowing through the second avalanche photodiode due to application of the second bias voltage,
wherein the first voltage applicator includes a digital-to-analog converter (DAC) or a microcomputer for generating a control voltage in the first voltage applicator, and the second voltage applicator includes a DAC or a microcomputer for generating a control voltage in the second voltage applicator, and
wherein the first voltage applicator is connected to a ground terminal, and the second voltage applicator is connected to a switch for switching between a ground terminal and an error terminal.

2. A device, comprising:
a light source configured to output inspection light toward a measurement target;
a magneto-optical crystal configured to be disposed so as to face the measurement target; and
the detector according to claim 1,
wherein the first avalanche photodiode detects first inspection light having a first polarization component output from the light source and reflected by the magneto-optical crystal, and the second avalanche photodiode detects second inspection light having a second polarization component output from the light source and reflected by the magneto-optical crystal.

3. The detector according to claim 1, wherein a first resistance voltage dividing circuit for generating a control voltage in the first voltage applicator is connected to the first voltage applicator, and a second resistance voltage dividing circuit for generating a control voltage in the second voltage applicator is connected to the second voltage applicator.

* * * * *